United States Patent
Roach

(10) Patent No.: US 7,312,581 B2
(45) Date of Patent: Dec. 25, 2007

(54) CIRCUITRY AND METHODS FOR IMPROVING THE PERFORMANCE OF A LIGHT EMITTING ELEMENT

(75) Inventor: Steven D Roach, Colorado Springs, CO (US)

(73) Assignee: Linear Technology Corp., Milpitas, CA (US)

( * ) Notice: Subject to any disclaimer, the term of this patent is extended or adjusted under 35 U.S.C. 154(b) by 399 days.

(21) Appl. No.: 11/176,126

(22) Filed: Jul. 6, 2005

(65) Prior Publication Data

US 2005/0242749 A1    Nov. 3, 2005

Related U.S. Application Data

(63) Continuation of application No. 10/003,096, filed on Dec. 6, 2001, now Pat. No. 7,049,759.

(51) Int. Cl.
*G09G 3/10*   (2006.01)
(52) U.S. Cl. ............... 315/169.3; 315/363; 372/43
(58) Field of Classification Search .. 315/169.1–169.3, 315/76, 224, 291, 363; 445/29, 44; 372/43, 372/45, 50
See application file for complete search history.

(56) References Cited

U.S. PATENT DOCUMENTS

| | | | | |
|---|---|---|---|---|
| 5,517,089 A | * | 5/1996 | Ravid | 315/307 |
| 6,169,371 B1 | * | 1/2001 | Zimlich et al. | 315/169.1 |
| 6,304,039 B1 | * | 10/2001 | Appelberg et al. | 315/169.3 |
| 6,344,780 B1 | * | 2/2002 | Dobashi et al. | 333/17.3 |

* cited by examiner

*Primary Examiner*—Douglas W. Owens
*Assistant Examiner*—Jimmy Vu
(74) *Attorney, Agent, or Firm*—McDermott Will & Emery LLP

(57) ABSTRACT

Light emitting elements with preselected or adjustable impedance characteristics are provided. Embodiments using a preselected impedance characteristic obtain significant performance benefits compared to the prior art. Embodiments having an adjustable impedance may alter the impedance associated with the light emitting component such that it has a substantially constant resistive or reactive impedance that improves certain performance attributes. This solution virtually eliminates the need for external compensation components and relieves the burden of impedance matching and circuit specialization from the driver circuit.

2 Claims, 3 Drawing Sheets

CIRCUITRY AND METHODS FOR IMPROVING THE PERFORMANCE OF A LIGHT EMITTING ELEMENT

CROSS REFERENCE TO RELATED APPLICATION

This is a continuation of, commonly assigned, U.S. patent application Ser. No. 10/003,096 filed Dec. 6, 2001 now U.S. Pat. No. 7,049,759.

BACKGROUND OF THE INVENTION

This invention relates to light emitting elements, and more particularly, to improving the performance characteristics of light emitting elements.

Light emitting elements such as light emitting diodes (LEDs), laser diodes, and vertical cavity surface emitting lasers (VCSELs) are used today in a wide variety of electronic applications. Common examples of products that employ light emitting elements include DVD players and high speed optical communications systems. Frequently, the role of light emitting elements involves the generation of light pulses for data acquisition or transmission. To function in this capacity, driver circuitry is typically utilized to supply the appropriate electrical differential across the light emitting element to generate digital optical signals.

Currently, many light emitting elements are fabricated with varying impedance values. A VCSEL, for example, typically has an impedance value that varies between about 17-50 Ohms. This variation poses problems for driver circuitry because of the likely impedance mismatch that results between the output of the driver circuitry and the input of the VCSEL. Foremost among these problems are the signal reflections that occur along the transmission line between the driver circuit and the VCSEL that reduce signal quality and limit response time.

Presently, this problem is dealt with by manipulating the operating characteristics of the driver circuitry. One popular solution, for example, includes the addition of external termination components that absorb reflected energy. This solution is not optimal because it requires system manufacturers to determine the impedance of each light emitting element individually and couple the appropriate compensation components to the driver circuitry. Other popular solutions include the use of precision driver modules that can accommodate an impedance mismatch without losing significant performance. Such systems, however, inevitably sacrifice certain amounts of bandwidth and frequency response.

Thus, in view of the foregoing, it would be desirable to provide circuits and methods that reduce or minimize the impedance variation associated with light emitting elements.

It would also be desirable to provide circuits and methods that enable adjustment of the transfer function associated with light emitting elements to improve or optimize certain performance attributes.

SUMMARY OF THE INVENTION

Thus, in view of the foregoing, it is an object of the present invention to provide circuits and methods that reduce or minimize the impedance variation associated with light emitting elements.

It is also an object of the present invention to provide circuits and methods that enable adjustment of the transfer function associated with light emitting elements to improve or optimize certain performance attributes.

These and other objects are accomplished in accordance with the principles of the present invention by providing light emitting elements with additional circuitry. The additional circuitry may have a preselected or adjustable impedance characteristic. Embodiments using a preselected impedance characteristic obtain significant performance benefits compared to the prior art. Embodiments having an adjustable impedance may alter the impedance associated with the light emitting component such that it has a substantially constant resistive or reactive impedance that improves certain performance attributes. This solution virtually eliminates the need for external compensation components and relieves the burden of impedance matching and circuit specialization from the driver circuit.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

FIG. 1 is an illustrative physical layout of a light emitting component 100 constructed in accordance with the principles of the present invention. Component 100 may include a bond pad 110, an adjustable resistor 120, and a light emitting element 130. Although component 100 is depicted as a "chip-on-board" type package, any other suitable packages types such a dual inline packages (DIPs) and "can" packages may be used if desired.

Light emitting element 130 may be any circuit element suitable for generating light pulses such as an LED, a laser diode, a VCSEL, etc. Adjustable resistor 120 may be created from any material suitable for forming resistive elements on an a substrate such as a metal resistor formed from the same material as bond pad 110 or a thin-film or thick-film type resistor.

Figure 2:
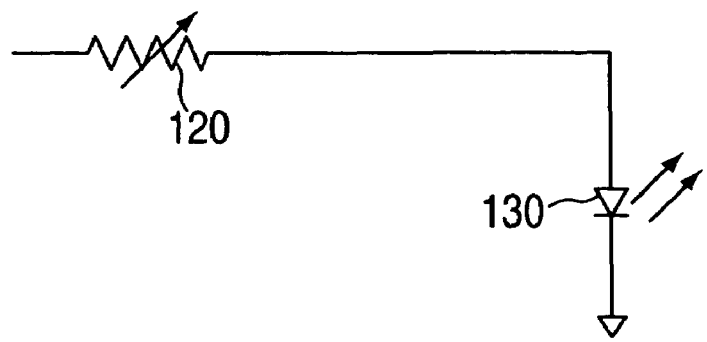
FIG. 2 is a schematic diagram of the physical layout shown in FIG. 1.

In operation, driver circuitry (not shown) is coupled to light emitting element 130 via bond pad 110, adjustable resistor 120, and signal paths 115 and 125. Signals from the driver circuitry pass through resistor 120 and into light emitting element 130 turning it ON and OFF to produce light pulses. A schematic representation of component 100 is shown in FIG. 2.

The purpose of adjustable resistor 120 is to normalize the impedance variation associated with light emitting element 130 so the equivalent input impedance of light emitting component 100 is a substantially constant predetermined value. For example, if a given light emitting element has an impedance of 29 Ohms, and another light emitting element manufactured from the same process has an impedance of 34 Ohms, resistors 120 may be adjusted to 21 Ohms and 16 Ohms, respectively, so that both components have an input impedance of 50 Ohms. This configuration allows circuit manufacturers to produce light emitting components having a predetermined substantially constant impedance and thus virtually eliminate the need for compensation components or other specialized circuit drivers.

Determining the proper value of adjustable resistor 120 may be accomplished in several ways. One method includes manufacturing component 100 and measuring the resistance of light emitting element 130. Next, the value of resistor 120 is adjusted (e.g., trimmed) so that the total impedance of component 100 as seen from bond pad 110 is set at a desired value (e.g., 50 Ohms).

Another way of adjusting resistor 120 includes measuring the resistance of component 100 from bond pad 110 and adjusting resistor 120 until the total impedance of component 100 as seen from bond pad 110 reaches the desired value.

In some instances, it may be desirable to adjust the value of resistor 120 while monitoring the optical response of component 100. This may be done to obtain a particular optical response from component 100 (e.g., to optimize an "eye opening") irrespective of input impedance.

In an alternate embodiment of component 100, resistor 120 may be fabricated to a nominal fixed value subject to variations associated with resistor fabrication (e.g., within about ±20% of the intended value). In this case, resistor 120 is not adjusted, and its function is merely to bring the total impedance of light emitting component 100 to a more desirable value. For example, assume the average impedance of a particular group of light emitting elements 110 is known to be 31.6 Ohms and to lie between 20 Ohms and 50 Ohms in all cases. In a commonly encountered 50 Ohm transmission line environment, a light emitting component would suffer from reflections of 43% at a minimum value of 20 Ohms. With this in mind, a manufacturer may construct resistor 120 such that its nominal value is also 18.4 Ohms subject to manufacturing tolerances so the final impedance of component 100 is about 50 Ohms. With this arrangement, the worst case reflection would be reduced by a factor of 2, or down to about 23%.

It will be appreciated from the above that the impedance of component 100 may be set to one of numerous values as specified, for example, by customer requirements. In most cases, the only restriction on this feature is the minimum impedance of light emitting element 130. Thus, if desired, the equivalent impedance of light emitting component 100 may be increased to values significantly greater than the original impedance value of light emitting element 100.

Furthermore, in an another embodiment of the present invention, a "template" version of component 100 may be provided with little or no adjustment of resistor 120. In this case, a user, such as a component manufacturer, may adjust resistor 120 to meet specific needs. For example, a template version of component 100 may be coupled to a specific driver circuit. Next, resistor 120 may be adjusted to attain a substantially perfect impedance match between the driver circuit and component 100 to optimize system performance. This type of "component customization" makes component 100 suitable for use in a wide variety of high performance applications such as those that involve coding schemes with high overheads or require fast data transfer rates with limited error tolerance.

It will be understood that resistor 120 may be adjusted during various stages of fabrication of component 100 including adjustment of the final product. For example, resistor 120 may be adjusted at the wafer level, during construction of the optical subassembly (e.g., when an optical connector is attached and aligned with element 130), during module assembly (e.g., the addition of driver circuitry and component packaging), or by an end item user.

Moreover, additional network components may be added to light emitting component 100 to adjust the current threshold (i.e., the magnitude of a drive signal required to produce a desired minimum light level) and the slope efficiency (i.e., the incremental response of the optical output signal of element 110 compared to the drive signal when the drive signal is above the threshold level) of light emitting element 130.

Figure 1A:
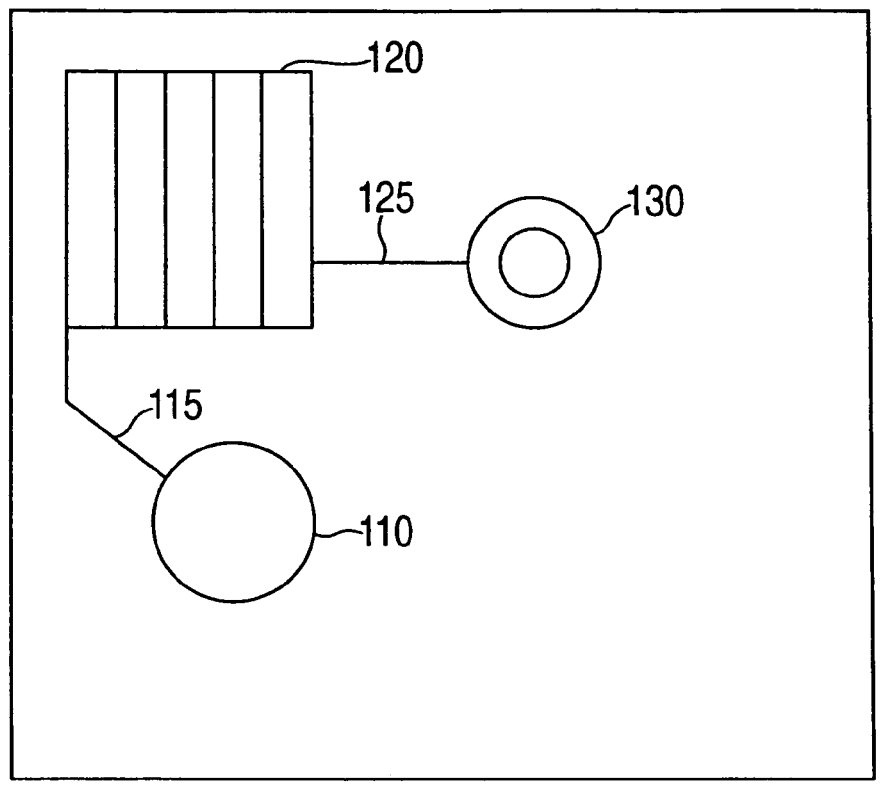
FIG. 1A is an illustrative physical layout of a light emitting component constructed in accordance with the principles of the present invention.
Figure 1B:
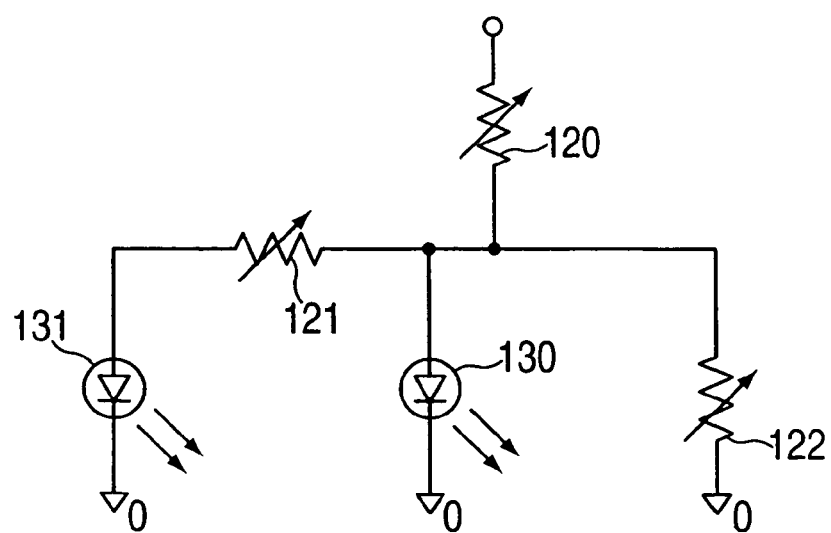
FIG. 1B is a schematic diagram of additional circuitry that may be included in the light emitting component of FIG. 1.

For example, as shown in FIG. 1B, adjustable resistors 121 and 122 and light emitting element 131 may be added to component 100, if desired. With this embodiment, light emitting element 131 acts as a voltage clamp to bias light emitting element 130. The optical output produced by element 131 is not necessarily used. Resistor 121 may be adjusted to divert a portion of an applied drive signal away from element 130 and into element 131, thereby reducing the optical output of element 130. With this capability, it is possible to vary the value of resistor 121 so that the optical output of element 130 reaches a predetermined level for a given value of drive current. This allows the selection of predefined and substantially constant electrical-to-optical conversion parameters for component 100 despite the large variations in efficiency commonly associated with element 130.

In addition, the current threshold at which light emitting element 130 emits light may be set to a predetermined value by adjusting variable resistor 122.

It will be appreciated that the features of the present invention shown in FIGS. 1A and 1B may be used separately, together, or in various combinations depending upon the desired functionality. For example, component 100 may be constructed such that it includes only light emitting element 130 and variable resistor 122. In this embodiment, component 100 would have a preset current threshold but not a preset input impedance or a normalized electrical-to-optical conversion efficiency. All combinations and permutations of these features shall be recognized as within the scope of the present invention.

Figure 3:
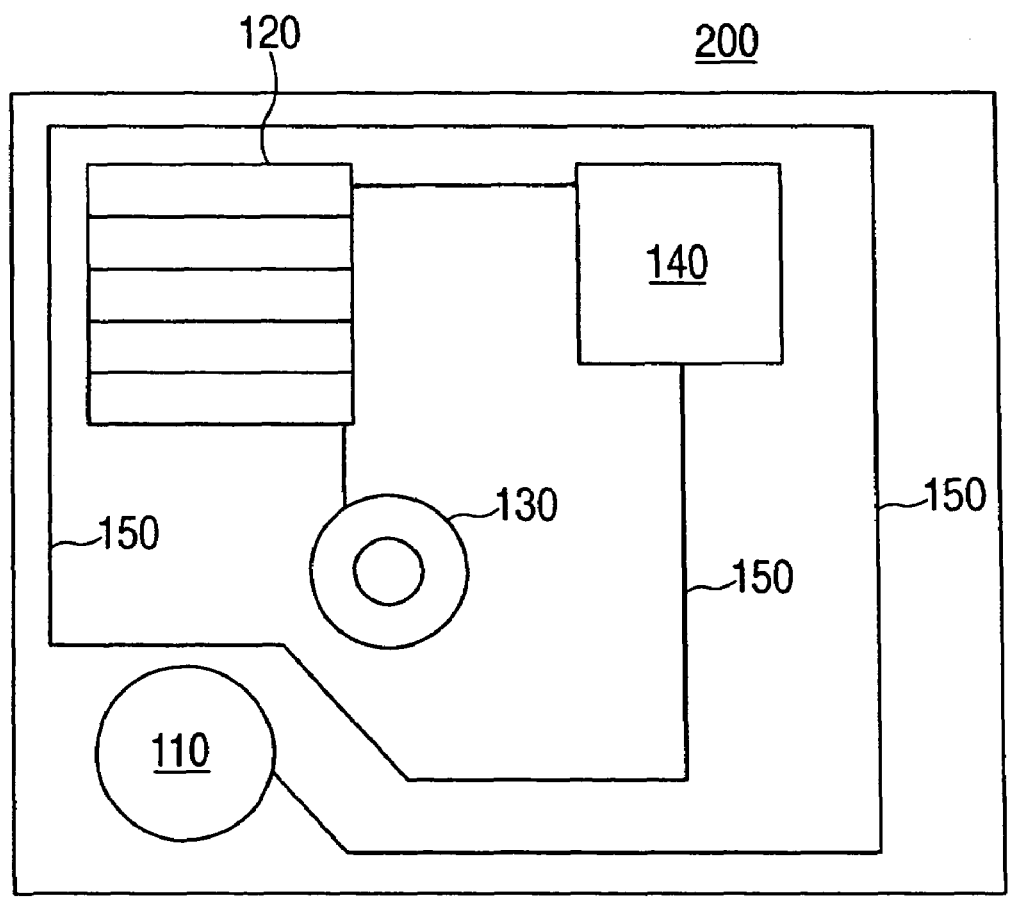
FIG. 3 is an illustrative physical layout of another light emitting component constructed in accordance with the principles of the present invention.

FIG. 3 is an illustrative physical layout of a light emitting component 200 constructed in accordance with the principles of the present invention. Component 200 is similar to component 100 and further includes adjustable capacitor 140 and adjustable inductor 150. Although component 200 is depicted as a "chip-on-board" type package, any other suitable packages types, such as a dual inline packages (DIPs) and "can" packages may be used if desired. Component 200 may also employ some or all of the circuit elements shown in FIG. 1B.

The primary purpose of adjustable capacitor 140 and adjustable inductor 150 is to permit variation of the transfer function associated with light emitting component 200. With this arrangement, circuit manufacturers may produce light emitting components with specialized transfer functions that improve or optimize certain performance characteristics. For example, by adjusting the values of some or all of the circuit elements on component 200, it is possible to obtain a substantially resistive characteristic impedance (e.g., by "tuning out" or compensating for package and coupling reactance).

The arrangement of FIG. 3 may also be used to create transfer functions that improve or optimize other performance characteristics such as high frequency response, time domain response, transition time, settling time, bandwidth, jitter, etc. Such optimization may include adjusting some or all of the circuit elements on component 200 to vary the shape of an optical pulse produced by element 130 to conform with a certain "mask" or to be compliant with a particular communications standard (e.g., SONET).

In an alternate embodiment of component 200, capacitor 140 and inductor 150 may be fabricated to nominal fixed values subject to variations associated with component fabrication (e.g., within about ±20% of the intended value). In this case, these components are not adjusted, and their function is merely to improve one or more of the above-mentioned performance characteristics of component 200.

Figure 4:
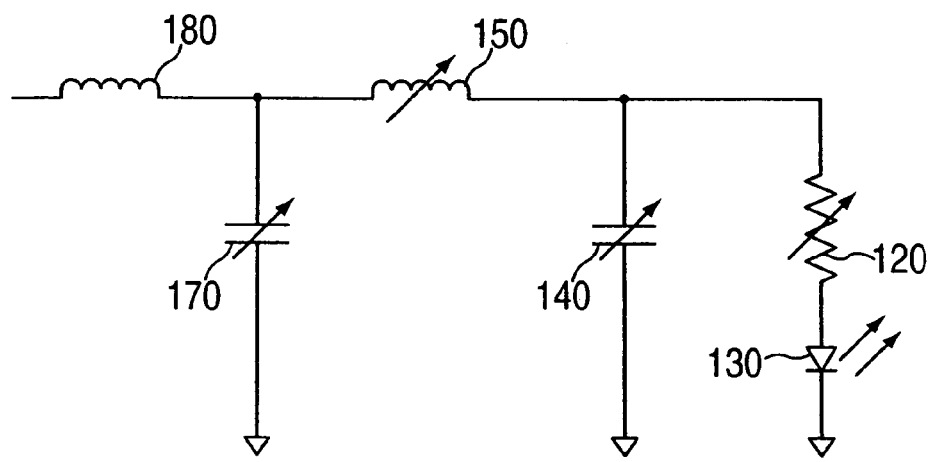
FIG. 4 is a schematic diagram of the equivalent circuit associated with the physical layout shown in FIG. 3.

FIG. 4 shows an equivalent circuit of the physical layout shown in FIG. 3. In FIG. 4, inductor 180 represents the inductance associated with a bond wire that connects to bond pad 110 (not shown), and capacitor 170 represents the capacitance associated with bond pad 110. Light emitting element 130 is schematically represented as a laser diode.

Figure 5:
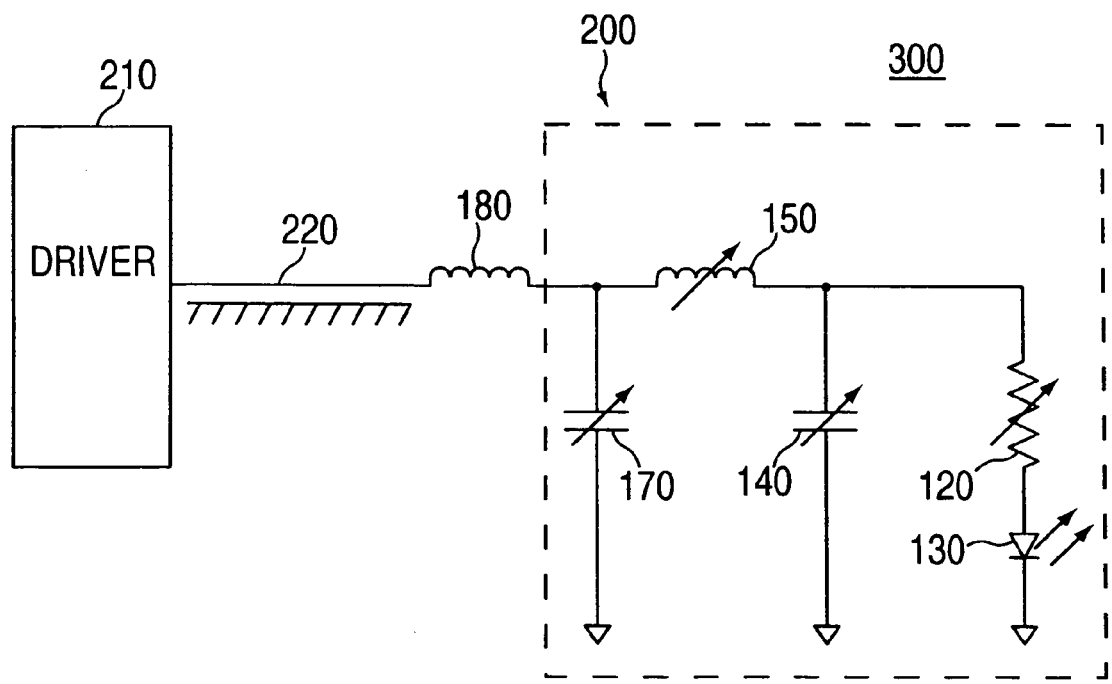
FIG. 5 is a schematic diagram of a light emitting component constructed in accordance with the principles of the present invention coupled to driver circuitry through a transmission line.

FIG. 5 shows a driver circuit 210 coupled to light emitting component 200 through a transmission line 220. In this embodiment, the value of resistor 120 may be adjusted to normalize the impedance of light emitting element 130 to a value matching the characteristic impedance of transmission line 220 for proper line termination. The values of adjustable capacitor 140 and adjustable inductor 150 may be set to compensate for transients associated with packaging reactance. In other embodiments, driver circuit 210 may be coupled directly to component 200 using "chip-to-chip wire bonding" with no intervening transmission line (not shown). In this case, the value of bond wire inductance 180 may be somewhat greater than that associated with arrangement in FIG. 5.

It will be appreciated, that, in many cases circuit elements 120, 140, and 150 may be disposed on light emitting components 100 and 200 without deviating from normal fabrication techniques. For example, inductors, capacitors, and resistors may all be formed from the metal used to make bond pads and circuit traces.

A spiral inductor, for example, having a value of approximately 1.2 nH may be formed by creating three concentric metal spirals having an outermost diameter of about 100 µm using 5 µm wide metal spaced apart about 1 µm. This specific implementation is merely exemplary and many other inductor configurations are possible. The inductance value may be increased or decreased as desired by changing the diameter of the spiral, the width of the metal, and the spacing between the portions of the metal used to form the inductor. Further, the inductor may be generally arranged as shown in FIG. 3 to avoid overlapping with other metal traces.

Capacitors may be formed by depositing a metal plate on top of the die used to form the light emitting component. The resulting capacitance depends on the size of the metal plate and the process used to create the die.

Various other known integrated circuit processing techniques may be used if desired to enhance the performance of these passive circuit elements. For example, masking, plating, and etching techniques may be used to thicken inductor metal or thin resistor metal to lower resistance. A high resistance base metal such as SiCr, NiCr, or tungsten may be used to form resistors. Thin or thick film conductive layers may be added to the die to form physically smaller resistors having large resistance values with reduced parasitic capacitance to the substrate. Thin or thick film dielectric layers may be added to form parallel plate capacitors or to allow trace crossovers. Diffused or ion implanted resistors, junction capacitors, and conductors may be created using photo lithographical techniques, etc.

It will be further appreciated that various methods may be used to adjust the values of the above-described components. For example, trimming may be done with a laser or abrasive on capacitor 140 or resistor 120. Such trimming may be performed while measuring the resistance, capacitance, or other parameters of light emitting components 100 and 200. Resistor 120, capacitor 140, and inductor 150 may be trimmed with a continuous adjustment, or by cutting constituent segments or tabs in discrete steps. Any such suitable method may be used. In certain embodiments, component adjustment may be done economically at the wafer level before the wafer is cut into individual components.

Persons skilled in the art will appreciate that the present invention can be practiced by other than the described embodiments, which are presented for purposes of illustration and not of limitation, and the present invention is limited only by the claims which follow.

What is claimed is:

1. A system comprising:
   a substrate;
   a light emitting element fabricated on said substrate;
   an impedance circuit fabricated on said substrate, wherein said impedance circuit is coupled to said light emitting element;
   driver circuitry for providing signals through said impedance circuit into said light emitting element for turning said light emitting element ON and OFF;
   circuitry for measuring the total impedance of said light emitting element and the impedance of said impedance circuit; and
   circuitry for trimming said impedance circuit until said measured total impedance reaches a predetermined value.

2. A method for fabricating light emitters comprising:
   fabricating a plurality of light emitter circuits, wherein each circuit comprises:
   a substrate;
   a light emitter fabricated on said substrate;
   an adjustable impedance circuit fabricated on said substrate;
   measuring a total impedance of each of said plurality of light emitter circuits by measuring the sum of the impedances of said light emitter and adjustable impedance circuit for each of said plurality of light emitter circuits; and
   trimming said adjustable impedance circuit of each of said plurality of light emitter circuits until said total impedance for each of said plurality of light emitter circuits reaches a predetermined impedance.

* * * * *